United States Patent
Ruzanski

(10) Patent No.: US 10,359,543 B2
(45) Date of Patent: Jul. 23, 2019

(54) FORECASTING LIGHTNING ACTIVITY

(71) Applicant: Vaisala, Inc., Louisville, CO (US)

(72) Inventor: Evan Ruzanski, Boulder, CO (US)

(73) Assignee: Vaisala, Inc., Louisville, CO (US)

( * ) Notice: Subject to any disclaimer, the term of this patent is extended or adjusted under 35 U.S.C. 154(b) by 437 days.

(21) Appl. No.: 15/187,598

(22) Filed: Jun. 20, 2016

(65) Prior Publication Data

US 2017/0363773 A1 Dec. 21, 2017

(51) Int. Cl.

| | | |
|---|---|---|
| *G01S 13/86* | (2006.01) | |
| *G01W 1/10* | (2006.01) | |
| *G01S 13/95* | (2006.01) | |
| *G01R 29/08* | (2006.01) | |
| *G01W 1/16* | (2006.01) | |

(52) U.S. Cl.
CPC ............ *G01W 1/10* (2013.01); *G01R 29/0842* (2013.01); *G01S 13/86* (2013.01); *G01S 13/951* (2013.01); *G01W 1/16* (2013.01); *Y02A 90/18* (2018.01)

(58) Field of Classification Search
CPC ...... G01S 13/86; G01S 13/951; G01S 13/953; G01S 7/025; G01S 7/412; G01S 13/95; G01W 1/10; G01W 1/16; G01W 1/02; Y02A 90/18; Y02A 90/14; G01K 2203/00
USPC .......................................................... 342/26
See application file for complete search history.

(56) References Cited

U.S. PATENT DOCUMENTS

| | | | | |
|---|---|---|---|---|
| 5,406,481 | A * | 4/1995 | Shinozawa | G01S 15/885 702/3 |
| 6,683,609 | B1 * | 1/2004 | Baron, Sr. | G01W 1/10 345/419 |
| 9,864,055 | B1 * | 1/2018 | Sishtla | G01S 13/953 |
| 2011/0090111 | A1 * | 4/2011 | Stagliano, Jr. | G01S 7/025 342/26 R |
| 2011/0267224 | A1 * | 11/2011 | Venkatachalam | G01S 13/951 342/26 R |
| 2012/0078836 | A1 * | 3/2012 | Havin | G01W 1/10 706/52 |
| 2013/0345982 | A1 * | 12/2013 | Liu | G01W 1/16 702/4 |

FOREIGN PATENT DOCUMENTS

JP           2004069478    *   4/2003

* cited by examiner

*Primary Examiner* — Timothy X Pham
(74) *Attorney, Agent, or Firm* — Maschoff Brennan; Paul G. Johnson

(57) ABSTRACT

Systems and methods are disclosed for forecasting lightning activity. Such a method may include obtaining radar reflectivity data from a radar detection device for multiple altitudes over an environmental region for a past period of time, and dividing the reflectivity data into multiple sub-regions within the region. The method may also include obtaining lightning discharge data for the environmental region from a lightning discharge detecting device for a past period of time, and establishing a customizable mathematical operator based on the radar reflectivity data and the lightning discharge data. The method may additionally include receiving forecast radar data for at least one of the sub-region for a future time period, and forecasting a probability of lightning strikes in at least one of the sub-regions based on applying the customizable mathematical operator to the forecast radar data.

20 Claims, 5 Drawing Sheets

FORECASTING LIGHTNING ACTIVITY

SUMMARY

One or more embodiments of the present disclosure may include a system for weather prediction. The system may include a radar detection device configured to receive reflections of radar waves reflecting from multiple altitudes within an environmental region and generate reflectivity data representing the reflections. The system may also include a lightning discharge detecting device configured to generate lightning discharge data representing location and time of lightning discharges within the environmental region, and a computing device in communication with the radar detection device and the lightning discharge detecting device. The computing device may be configured to receive the reflectivity data from the radar detection device, divide the reflectivity data into a plurality of sub-regions within the environmental region, and integrate the reflectivity data across the plurality of altitudes for the sub-regions. The computing device may also be configured to receive the lightning discharge data from the lightning discharge detecting device, and select a regularization operator and a weighting term used in determining a relational operator based on the reflectivity data and the lightning discharge data. The computing device may additionally be configured to determine the relational operator that relates reflectivity data to lightning discharge data based on the regularization operator and the weighting term, obtain forecasted radar data predicting future reflectivity data for the environmental region, and forecast a probability of lightning strikes in at least one of the sub-regions based on forecasted radar data and the relational operator.

In accordance with one or more systems or methods of the present disclosure, the regularization operator and the weighting term may be selected using a grid search approach of potential values for the regularization operator and the weighting term with the received reflectivity data and the received lightning discharge data.

In accordance with one or more systems or methods of the present disclosure, the regularization operator may be represented by $\Gamma$, the weighting term may be represented by $\lambda$, the relational operator may be represented by $C$, the integrated reflectivity data may be represented by $Z_i$, and the lightning discharge data may be represented by $L$, and the relations operator may be determined using $$C=(Z_i^T Z_i + \lambda \Gamma^T \Gamma)^{-1} Z_i^T L.$$

In accordance with one or more systems or methods of the present disclosure, the computing device may be further configured to receive additional reflectivity data from the radar detection device, receive additional lightning discharge data from the lightning discharge detecting device, and revise the relational operator based on the additional reflectivity data and the additional lightning discharge data.

In accordance with one or more systems or methods of the present disclosure, the computing device may be further configured to revise the regularization operator and the weighting term based on the additional reflectivity data and the additional lightning discharge data.

In accordance with one or more systems or methods of the present disclosure, the relational operator may be further based on one or more additional regularization operators or additional weighting terms.

In accordance with one or more systems or methods of the present disclosure, the computing device may be further configured to generate the forecasted radar data.

In accordance with one or more systems or methods of the present disclosure, the computing device may be further configured to perform a grid search and validation to determine a spatial filter size to apply in generating the forecasted radar data.

In accordance with one or more systems or methods of the present disclosure, the computing device may be further configured to transmit the spatial filter size to a third party that generates the forecasted radar data.

One or more embodiments of the present disclosure may include a method that may include obtaining radar reflectivity data from a radar detection device for multiple altitudes over an environmental region for a past period of time, and dividing the reflectivity data into multiple sub-regions within the region. The method may also include obtaining lightning discharge data for the environmental region from a lightning discharge detecting device for a past period of time, and establishing a customizable mathematical operator based on the radar reflectivity data and the lightning discharge data. The method may additionally include receiving forecast radar data for at least one of the sub-region for a future time period, and forecasting a probability of lightning strikes in at least one of the sub-regions based on applying the customizable mathematical operator to the forecast radar data.

In accordance with one or more systems or methods of the present disclosure, establishing the customizable mathematical operator may include selecting a regularization operator and a weighting term based at least on the reflectivity data and the lightning discharge data, and determining a relational operator using at least the regularization operator and the weighting term.

In accordance with one or more systems or methods of the present disclosure, a method may include generating a message with a variable level of warning that corresponds to a density of the probability of lightning strikes.

In accordance with one or more systems or methods of the present disclosure, a method may include generating the probability of lightning strikes for each of a plurality of time segments.

In accordance with one or more systems or methods of the present disclosure, each of the probability of lightning strikes for each of the plurality of time segments is based on a different forecast for each of the plurality of time segments.

In accordance with one or more systems or methods of the present disclosure, the plurality of time segments span between approximately zero and one hundred and twenty minutes.

These illustrative embodiments are mentioned not to limit or define the disclosure, but to provide examples to aid understanding thereof. Additional embodiments are discussed in the Detailed Description, and further description is provided there. Advantages offered by one or more of the various embodiments may be further understood by examining this specification or by practicing one or more embodiments presented.

BRIEF DESCRIPTION OF THE FIGURES

These and other features, aspects, and advantages of the present disclosure are better understood when the following Detailed Description is read with reference to the accompanying drawings.

DETAILED DESCRIPTION

Systems and methods are disclosed that relate to forecasting of lightning activity. In accordance with the present disclosure, a customizable mathematical operator (e.g., a relational operator) may be derived that relates forecasted reflectivity data to forecasted lightning activity such that by applying the customizable mathematical operator to forecasted reflectivity data, forecasted lightning activity may be obtained. To derive the customizable mathematical operator, radar reflectivity data and lightning strike data may be obtained for an environmental region. Using that obtained data, a regularization operator and a weighting term used to find the customizable mathematical operator may be selected and/or optimized. The regularization operator and weighting term may be used with the obtained data to derive the customizable mathematical operator. The customizable mathematical operator may then be used in conjunction with forecasted radar reflectivity data to generate a forecast of lightning activity. The customizable mathematical operator may be adjusted and modified to fit a particular profile of a particular storm by updating and customizing the mathematical operator as additional reflectivity data and/or lightning discharge data is obtained.

Figure 1:
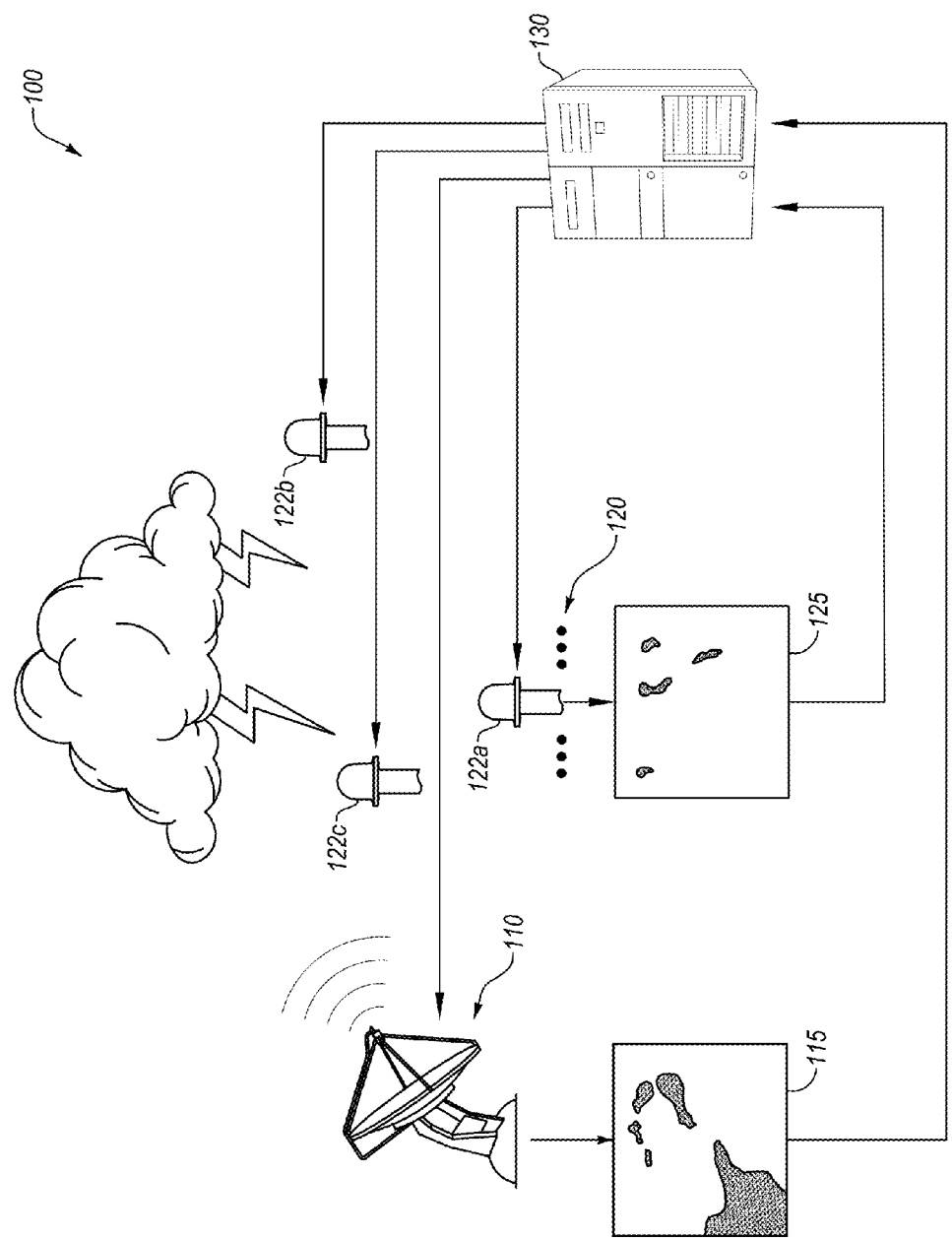
FIG. 1 illustrates an example system for forecasting lightning activity.

FIG. 1 illustrates an example system 100 for forecasting lightning activity, in accordance with one or more embodiments of the present disclosure. The system 100 may include a radar system 110, a lightning detection system 120, and a computing device 130. The radar system 110 may generate radar reflectivity data 115 and the lightning detection system 120 may generate lightning discharge data 125. The computing device 130 may obtain the radar reflectivity data 115 and the lightning discharge data 125 and may use such data to generate a forecast of lightning activity. The computing device 130 may determine and/or optimize certain variables associated with forecasting lightning activity.

In some embodiments, the radar system 110 may transmit electromagnetic waves (e.g., microwaves) towards a region of interest (e.g., an atmospheric region, an environmental region, etc.) or object of interest. The radar system 110 may receive reflections of the electromagnetic waves off of an object or objects, such as a storm system or precipitation (e.g., rain, ice, sleet, hail, etc.). Such reflections may be referred to as reflectivity, and may be represented by Z (in units of $mm^6 \, m^{-3}$). In some embodiments, the radar system 110 may acquire the reflectivity data 115 at a series of increasing altitudes and may generate a series of constant altitude plan position indicators (CAPPIs). In some embodiments, the CAPPIs may be vertically integrated for a particular range of altitudes. The ranges of altitudes may be based on altitude above the surface of the earth or may be based on temperatures at a given altitude. For example, the CAPPIs may be integrated from the isothermal height of $-10°$ C. to $-40°$ C. In these and other embodiments, such a temperature range may be selected based on temperature ranges at which precipitation is expected to form, separation of charge may occur, and/or lightning strikes may occur or originate. In some embodiments, the CAPPIs may be separated into particular regions, grids, or other sub-regions. For example, across a given region of interest of two hundred square kilometers, the CAPPIs across that region may be subdivided into one kilometer square sub-regions. Any other processing, filtering, or accumulation of the reflectivity data 115 may be performed, for example, by the computing device 130. In these and other embodiments, any processing or data generation attributed to the radar system 110 may be performed by the computing device 130, or by any computing resource of the radar system 110.

The lightning detection system 120 may detect lightning strikes at various locations of a given region. The lightning detection system 120 and/or the computing device 130 may generate lightning discharge data 125. The lightning discharge data 125 may be represented by L. In some embodiments, the given region for which the lightning detection system 120 generates lightning discharge data 125 may correspond to the same or similar region in which the radar system 110 generates the reflectivity data 115. In some embodiments, the lightning discharge data 125 may be sub-divided into sub-regions that correspond to the sub-regions of the reflectivity data 115. Additionally or alternatively, the lightning discharge data 125 may include a time interval or time stamp that may correspond to a time interval or time stamp of the reflectivity data 115. For example, for a given point in time or span of time, the system 100 may include reflectivity data 115 and lightning discharge data 125 that correspond to that given point in time or span of time. In some embodiments, the lightning discharge data 125 may include lightning flash rate density data or other forms of lightning discharge data.

In some embodiments, the computing device 130 may utilize the reflectivity data 115 and the lightning discharge data 125 to determine a customizable mathematical operator, such as a relational operator. The customizable mathematical operator may be an algorithm or other mathematical form used to generate lightning discharge data from reflectivity data. A relational operator may be derived or determined using a regularization operator and/or a weighting term. For example, with multiple points in time of reflectivity data 115 and lightning discharge data 125, the regularization operator and weighting terms may be selected and/or optimized such that the relational operator is derived based on a given storm system, on a given region, etc. In these and other embodiments, assumptions previously made in the art may be avoided to yield a more accurate lightning discharge forecast. For example, using the relational operator and forecasted reflectivity data, lightning discharge data may also be forecasted. The regularization operator may function during derivation of the relational operator to replace an original relational operator with a better-conditioned but related operator to reduce the effect of noise in the reflectivity data and lightning discharge data. The weighting term may be used to dictate how large of an impact the regularization operator has on the derivation of the relational operator. In some embodiments, a Tikhonov regularization may be performed.

In some embodiments, the relational operator may be represented by C. Stated mathematically:

$$Z_t C = L_t \qquad \text{Equation (1)}$$

where $Z_t$ represents a matrix of integrated reflectivity data at time t and $L_t$ represents a matrix of lightning discharge data at time t or for some fixed portion of time related to time t (e.g., from time t and back in time some fixed amount of time). In some embodiments, the value of $Z_t$ may be represented by the equation:

$$Z_t = \int_{H_1}^{H_2} Z_e^{4/7}(x,y,t) dH \qquad \text{Equation (2)}$$

where $Z_e$ represents the reflectivity data, x and y represent the horizontal and vertical coordinates in a given region of interest, t represents time (e.g., a time associated with the reflectivity data), and $H_1$ and $H_2$ represent the altitudes over which the reflectivity data is integrated (e.g., a given H may represent the altitude corresponding to the CAPPI of the reflectivity data at the altitude H). Following the example given above, if the reflectivity data were integrated over the isothermal height of −10° C. to −40° C., $H_1$ may represent the altitude corresponding to −10° C. and $H_2$ may represent the altitude corresponding to −40° C.

The relational operator C may be solved for by an inversion of the integrated reflectivity data, or, stated mathematically, $$C = Z_t^{-1} L_t \qquad \text{Equation (3)}$$

Using the regularization operator and the weighting term, the relational operator may be derived using the following equation:

$$C = (Z_t^T Z_t + \lambda \Gamma^T \Gamma)^{-1} Z_t^T L \qquad \text{Equation (4)}$$

where $Z_t^T$ may represent a transposition of the matrix $Z_t$, $\lambda$ may represent the weighting term, and $\Gamma$ may represent the regularization operator (with $\Gamma^T$ representing a transposition of $\Gamma$).

The regularization operator ($\Gamma$) may be selected from a particular set of matrices that may provide a particular regularization effect. For example, the regularization operator may be the identity matrix (e.g., a zero-order derivative) to yield a small norm. As another example, the regularization operator may include a discrete approximation of a first- or second-order derivative operator. In some embodiments, the regularization operator may be limited to one of three values that include a zero-, first-, or second-order derivative operator.

In some embodiments, the weighting term ($\lambda$) may take any value greater than zero (e.g., $\lambda > 0$). In these and other embodiments, the values of the weighting term may be constrained in a range of potential values (e.g., greater than zero and less than one, less than ten, less than one hundred, less than one thousand, less than one million, etc.). As additional examples, the value of 80 may include any value between approximately 10,000 and 1,000,000. In these and other embodiments, the potential values of the weighting term and/or constraints placed on potential values may be based on particular information for the region of interest (e.g., historical values of the weighting term, etc.). In some embodiments, a variety of values of the weighting term may be used to optimize the relational operator (C).

In some embodiments, a heuristic approach may be followed in deriving the relational operator (C) using Equation (4). For example, for multiple points in time for which reflectivity data (Z) and/or lightning discharge data (L) is available, a variety of values of the weighting term ($\lambda$) and regularization operator ($\Gamma$) may be utilized to verify and/or optimize the relational operator (C). For example, the weighting term and regularization operator may be varied such that they most closely provide the expected values of lightning discharge data based on the historic reflectivity data.

In some embodiments, after the relational operator has been derived, the relational operator may be applied to forecasted reflectivity data to yield forecasted lightning discharge density data. For example, a forecast may be generated for the region of interest (e.g., $Z_f$), and the relational operator may be applied to the forecast to yield a forecast of lightning activity (e.g., $Z_f C = L_f$). In some embodiments, the forecasted reflectivity data may include a short-term automated forecast, sometimes referred to as a "now-cast." For example, the forecasted reflectivity data may be forecasted approximately less than six hours in the future, less than four hours in the future, less than two hours in the future, less than sixty minutes in the future, less than forty minutes in the future, or less than thirty minutes in the future. In these and other embodiments, the forecasted reflectivity may be forecasted by the computing device 130, by a human operator of the computing device 130, or by a third party weather predicting service.

In some embodiments, after an initial forecast has been generated for the lightning activity, one or more of the factors contributing to the relational operator (C) may be updated. In these and other embodiments, in the intervening time between the initial forecast and the later point in time, additional reflectivity data 115 and/or lightning discharge data 125 may be obtained. Using the additional data, one or both of the weighting term ($\lambda$) and the regularization operator ($\Gamma$) may be updated. In these and other embodiments, modification of the weighting term and/or the regularization operator may be constrained to a certain percent change, to a certain absolute value change, or may be unrestrained. Such an update may occur in a similar manner to the original derivation of the relational operator (C) and/or may use the initially derived value of the relational operator as a starting point in the optimization/derivation process. For example, a similar heuristic approach using Equation (4) may be utilized.

In some embodiments, a new forecast of lightning activity may be generated at regular intervals, such as every five minutes, every ten minutes, every fifteen minutes, every hour, etc. In these and other embodiments, updating of the relational operator may be performed with every new forecast, a time related to new forecasts (e.g., two minutes before every forecast), or less regularly (e.g., with every other forecast, once per hour, etc.). In some embodiments, updating of the relational operator may be independent of when forecasts are generated (e.g., the relational operator may be updated with each newly received reflectivity data, with every other new reflectivity data, every five minutes regardless of when forecasts are generated, etc.).

In some embodiments, more than one regularization operator and/or weighting terms may be incorporated into the derivation of the relational operator. For example, Equation (4) may be modified to include a second regularization operator and a second weighting term. For example:

$$C = (Z_t^T Z_t + \lambda_1 \Gamma_1^T \Gamma_1 + \lambda_2 \Gamma_2^T \Gamma_2 + \ldots)^{-1} Z_t^T L \qquad \text{Equation (5)}$$

By using multiple regularization operators and weighting terms, different behaviors and penalties may be introduced in the prediction of lightning activity. In these and other embodiments, one or more of the weighting terms may equal zero such that a particular regularization operator may not be used. Additionally or alternatively, the various regularization operators may include one or more of a zero-, first-, and/or second-order derivative (e.g., $\Gamma_1$ may be a zero-order derivative and $\Gamma_2$ may be a first-order derivative).

The radar system 110 may include any number of radar transmitters and receiver that may work independently or in cooperation to generate and/or acquire the radar reflectivity data 115. In some embodiments, one or more radars of the radar system 110 may generate their own beams. For example, reflectivities may be measured by one or more radar detectors of the radar system 110. One or more components of the radar system 110 may communicate with a computer system, such as the computing device 130. The radar system 110 may communicate data to the computing device 130, where the data may be processed. The radar system 110 may receive instructions from the computing device 130. The computing device 130 may be located remotely and/or off site from the radar system 110 in some embodiments. The computing device 130 may be coupled with the radar system 110. The various components of the radar system 110 may communicate with each other in some embodiments. In some embodiments, the radar system 110 may include a networked radar system. In a networked radar environment, any number of radar nodes may work collaboratively. The various nodes together may be considered as one system (e.g., the radar system 110) making measurements of the atmosphere.

In some embodiments, various components of the radar system 110 may be of many different types and operate at different frequencies in different embodiments. The radar system 110 may include radars that cover different frequency bands including, but not limited to, the following: S-band radars operating at frequencies of 2-4 GHz, which correspond to wavelengths of about 9-15 cm; C-band radars operating at frequencies of 4-8 GHz, which correspond to wavelengths of about 4-8 cm; X-band radars operating with frequencies of 8-12 GHz, which correspond to wavelengths of about 2.5-4 cm; and K-band radars operating with frequencies of 12-40 GHZ, which correspond to wavelengths of about 0.75-2.5 cm. In some embodiments, each component of the radar system 110 may operate at substantially the same frequency, but this is not a requirement, and in other embodiments, different components may operate at substantially different frequencies.

In some embodiments, one or more components of the radar system 110 may include monostatic radars, which may include both transmitter and receiver components. In some embodiments, the radar system 110 may include components that may have multiple transmitters and/or multiple receivers. In some embodiments, a component of the radar system 110 may include two transmitters, with one for horizontal polarization and one for vertical polarization, and two receivers, with one for horizontal polarization and one for vertical polarization. Additionally or alternatively, the radar system 110 may include components with analog receivers and/or digital receivers. In some embodiments, the radar system 110 may include components that may include a receiver, but not a transmitter, and/or components that may include a transmitter but not a receiver. In some embodiments, the radar system may include components that operate in modes such as bistatic receive mode or interferometric modes.

In some embodiments, the radar system 110 may include many different types of radars, including, for example, Doppler radars. In some embodiments, the radar system 110 may include components that may have polarimetric capabilities, capable of controlling the polarization of the transmitted wave for each pulse and the received polarization states from the return of each pulse. In some embodiments, components of the radar system 110 may include single polarization or dual polarization capabilities. For example, polarimetric radars may include the following without limitation: switched-dual polarization, dual-channel dual-polarization; and switched dual-channel, polarization-agile radar.

In some embodiments, the radar system 110 may include components with different capabilities. For example, some components may include radars with minimal processing capabilities. As another example, some components may include radars with limited agility on duty cycle and supported waveforms. As an additional example, some components may include low cost radars. A radar with a limited agility on duty cycle and an ability to support complex waveforms may be referred to as a legacy radar. As a further example, one or more components of the radar system 110 may include radars with advanced processing capabilities along with having more agility on duty cycle and ability to support complex waveforms. In some embodiments, the radar system 110 may include transmitters that include but are not limited to magnetron, solid-state, klystron, traveling wave tube, and microwave power module transmitters.

In some embodiments, the radar system 110 may be part of or include a network of radars. A network of radars may sometimes be referred to as a networked radar system ("NETRAD"). A network of radars may include multiple radars distributed geographically. A networked radar system may include radars with overlapping coverage. The network of radars may be in communication with a computer system which may include a processor and a controller. A processor may be used to process data received from the network of radars. In some embodiments, the radar system 110 may be network-controllable.

The lightning detection system 120 may include any combination of components, devices, and/or systems configured to generate lightning discharge data 125. For example, the lightning detection system 120 may include multiple lightning strike detectors 122 (e.g., the lightning strike detectors 122a, 122b, and 122c) distributed around a region of interest. The lightning detection system 120 may include a computing device (e.g., the computing device 130 and/or a computational system such as that illustrated in FIG. 5). The computing device of the lightning detection system 120 may facilitate converting signals and/or data received from the individual lightning detectors 122 into the lightning discharge data 125. In some embodiments, the lightning detection system may cover a broad region, such as the United States National Lightning Detection Network (NLDN) or the Global Lightning Dataset (GLD360), both owned by Vaisala. In some embodiments, one lightning strike may use information from multiple sensors to determine information about the lightning strike, such as location, magnitude, cloud-to-ground vs. cloud-to-cloud, etc.

The lightning strike detectors 122 may take any form of device or system as known in the art. For example, the lightning strike detectors 122 may be ground-based, mobile-based, or any combination thereof. As an additional example, the lightning strike detectors 122 may be portable or may be fixed in a given location. As another example, the lightning strike detectors 122 may be based on Very High Frequency (VHF) interferometry, Low Frequency (LF) magnetic direction finding, or combinations thereof.

Figure 5:
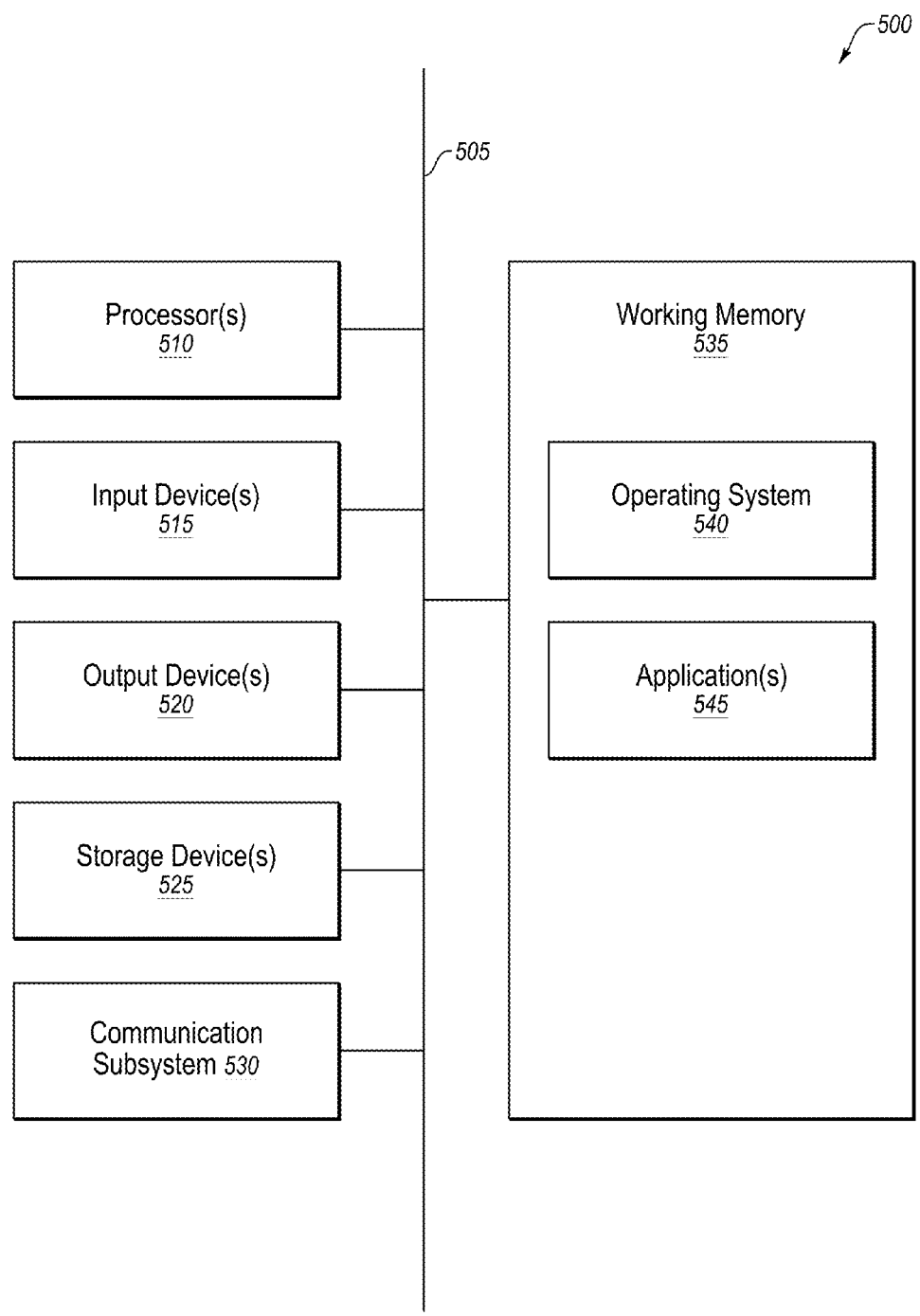
FIG. 5 illustrates an example computational system for performing functionality to facilitate implementation of embodiments described herein.

The computing device 130 may be any computing device and/or system, such as that illustrated in FIG. 5. The computing device 130 may include any of the components of the computational system 500 illustrated in FIG. 5. The computing device 130 may be used or maintained by any entity, such as a weather service, a university, a news station, etc.

In some embodiments, a dynamic hierarchical grid search and/or cross-validation may be performed to determine the size of a spatial filter to be used in generating forecasts and/or "nowcasts" of reflectivity data. For example, if a square filter kernel of side length l were used, the parameter l may also be used as one of the parameters solved for and optimized. In these and other embodiments, by adjusting the size and/or dimensions of sub-regions and/or the kernel size of the spatial filter, anomalies or inconsistencies observed because of spatial-filtering used in the forecasting approach used to generate the forecasted reflectivity data may be identified and/or removed. Based on the dynamic hierarchical grid search and/or the cross-validation, the size of the spatial filter may be determined and/or may be provided to the forecast-generating entity or device. For example, if the computing device 130 is generating the forecasted reflectivity data, the spatial filter may be communicated between processes and/or programs on the computing device 130 such that the revised spatial filter may be used. As another example, if the forecasted reflectivity data is provided by a third party, the spatial filter may be communicated to the third party.

Modifications, additions, or omissions may be made to FIG. 1 without departing from the scope of the present disclosure. For example, the system 100 may include more or fewer elements than those illustrated and described in the present disclosure. For example, the system 100 may include any number or types or varieties of radar devices as part of the radar system 110. As another example, while three lightning detectors 122 are illustrated, any number of lightning detectors may be present, including hundreds, thousands, millions, or more detectors.

Figure 2A:
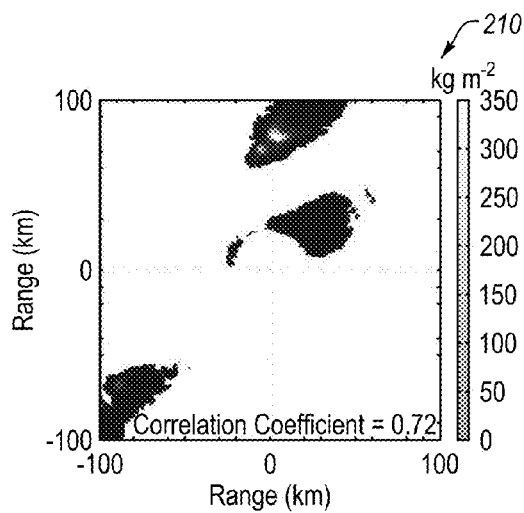
FIGS. 2A and 2B illustrate examples of lightning activity predictions based on prior approaches and the present disclosure, respectively.
Figure 2B:
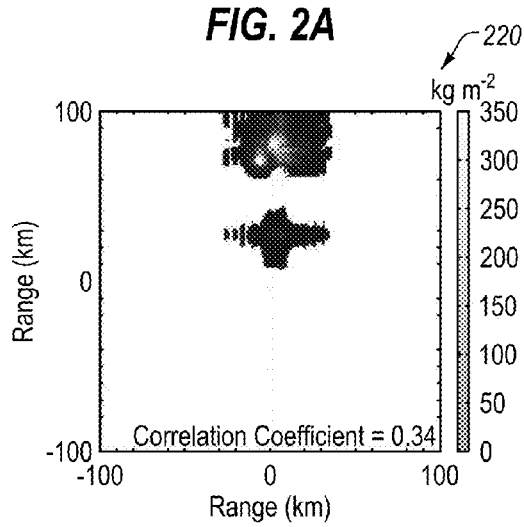
Figure 2C:
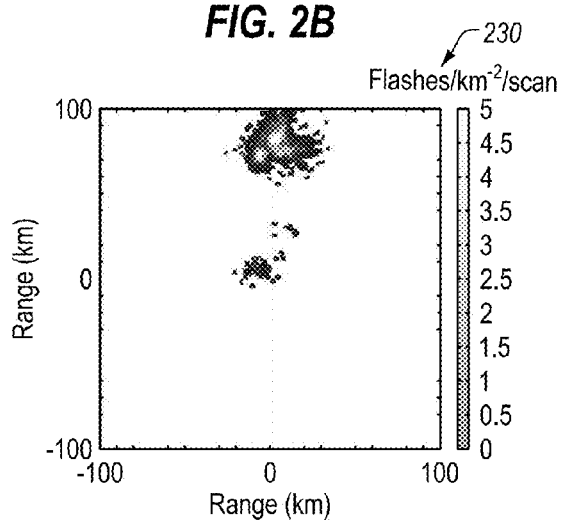
FIG. 2C illustrates an example view of actual lightning activity for the predictions of FIGS. 2A and 2B.
Figure 3A:
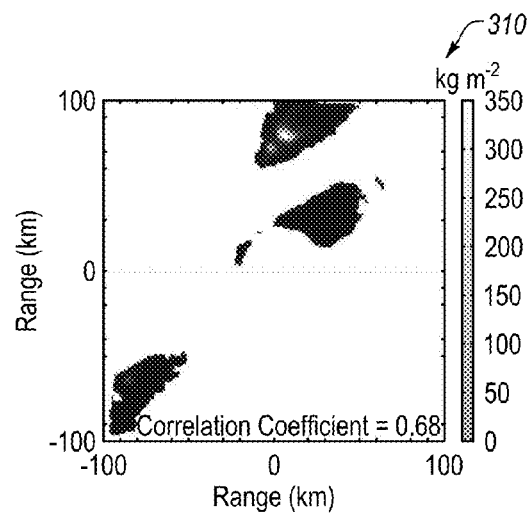
FIGS. 3A and 3B illustrate examples of lightning activity predictions based on prior approaches and the present disclosure, respectively.
Figure 3B:
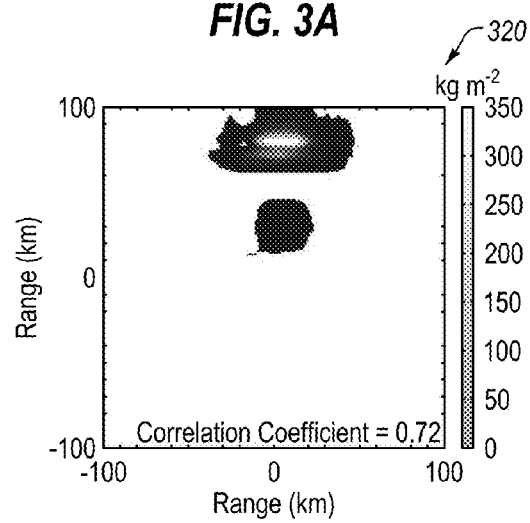
Figure 3C:
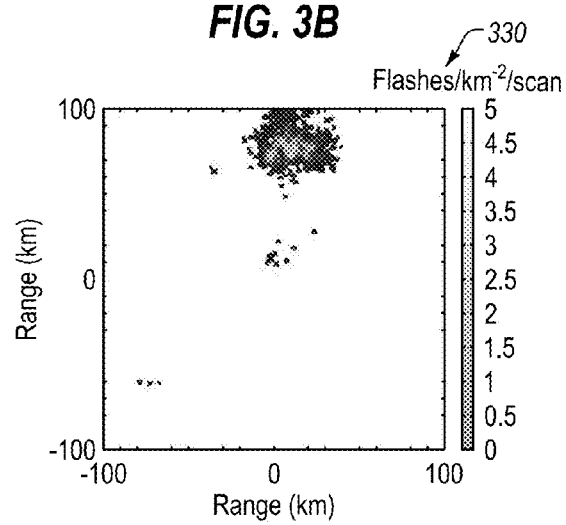
FIG. 3C illustrates an example view of actual lightning activity for the predictions of FIGS. 3A and 3B.

FIGS. 2A and 2B illustrate examples of lightning activity predictions based on prior approaches and the present disclosure, respectively. FIG. 2C illustrates an example view of actual lightning activity for the predictions of FIGS. 2A and 2B. FIGS. 3A and 3B illustrate examples of lightning activity predictions based on prior approaches and the present disclosure, respectively. FIG. 3C illustrates an example view of actual lightning activity for the predictions of FIGS. 3A and 3B. FIGS. 2A-2C and 3A-3C are visualizations of forecasts or actual recordation of lightning strike data associated with a storm monitored proximate Fort Worth, Tex. Forecasts of reflectivity data for the predictions in accordance with the present disclosure were generated using Dynamic Adaptive Radar Tracking of Storms (DARTS). FIGS. 2A and 2B illustrate a correlation coefficient relative to FIG. 2C and FIGS. 3A and 3B illustrate a correlation coefficient relative to FIG. 3C. The correlation coefficient illustrates the overlap or correlation between the forecasted data (e.g., FIGS. 2A-2B and 3A-3B) vs. the actual data (e.g., FIGS. 2C and 3C). FIGS. 2A and 2B illustrate a forecast for an initial time, and FIGS. 3A and 3B illustrate a forecast for a time approximately ten minutes in the future.

As illustrated in FIGS. 2A and 2B, the forecast of lightning activity in the first graph 210 (corresponding to a forecast based on prior approaches) includes a 0.72 correlation coefficient, while the forecast of lightning activity in the second graph 220 (corresponding to a forecast in accordance with the present disclosure) includes a 0.94 correlation coefficient. In other words, when comparing the first graph 210 of FIG. 2A with the second graph 220 of FIG. 2B, the second graph 220 more closely aligns with the third graph 230 of FIG. 2C (the actual lightning discharge data).

A similar trend is illustrated in FIGS. 3A-3C. In FIGS. 3A and 3B, the forecast of lightning activity in the first graph 310 (corresponding to a forecast approximately ten minutes in the future and based on prior approaches) includes a 0.68 correlation coefficient, while the forecast of lightning activity in the second graph 320 (corresponding to a forecast approximately ten minutes in the future and in accordance with the present disclosure) includes a 0.72 correlation coefficient. In other words, when comparing the first graph 310 of FIG. 3A with the second graph 320 of FIG. 3B, the second graph 320 more closely aligns with the third graph 330 of FIG. 3C (the actual lightning discharge data). Additionally, the second graph 330 of FIG. 3B corresponding with a forecast ten minutes in the future in accordance with the present disclosure was approximately correlated as well with the actual lightning discharge data as the forecast at the initial time based on prior approaches illustrated in the first graph 210 of FIG. 2A.

While FIGS. 3A-3C illustrate a forecast approximately ten minutes into the future, forecasts of lightning activity in accordance with the present disclosure may correlate more closely with actual data as the time window is extended beyond ten minutes. For example, using a threshold correlation coefficient of 1/e as a metric of useful forecast data, traditional approaches may cease providing useful forecasts at approximately twenty two minutes in the future. Methods and systems of the present disclosure may continue to provide useful forecasts up to approximately twenty seven minutes. Stated another way, methods and systems of the present disclosure may provide forecasts of lightning activity that correlate with actual lightning activity with a value of at least 1/e for at least approximately twenty seven minutes, or longer than twenty two minutes.

Figure 4:
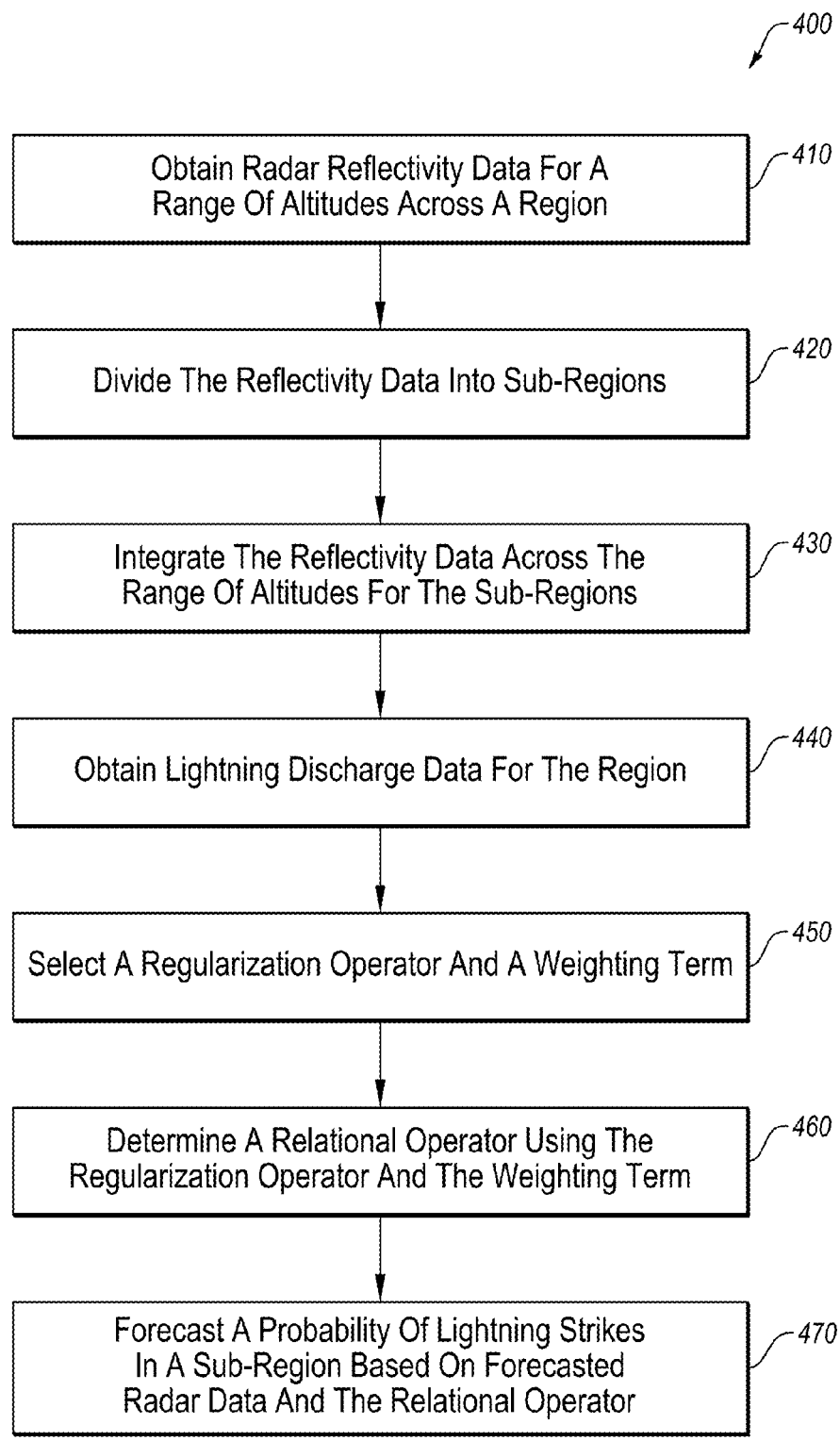
FIG. 4 illustrates a flow diagram of an example method for forecasting lightning activity.

FIG. 4 is a flowchart of an example method 400 for forecasting lightning activity, in accordance with one or more embodiment of the present disclosure. One or more steps of the method 400 may be implemented, in some embodiments, by one or more components of the system 100 of FIG. 1, such as the computing device 130. Although illustrated as discrete blocks, various blocks may be divided into additional blocks, combined into fewer blocks, or eliminated, depending on the desired implementation.

At block 410, radar reflectivity data may be obtained for a range of altitudes across a region. For example, the radar system 110 of FIG. 1 may emit a series of radar waves at progressing altitudes and the reflectivities of each of those progressing altitudes may be monitored by the radar system 110. Additionally or alternatively, the various reflectivity data may be compiled into CAPPIs.

At block 420, the reflectivity data may be divided into sub-regions. For example, the computing device 130 of FIG. 1 may divide the reflectivity data obtained at the block 410 into quadrants or other sub-regions, such as 1 km squares, etc.

At block 430, the reflectivity data may be integrated across the range of altitudes for the sub-regions. For example, the computing device 130 may integrate the reflectivity data from the isothermal height of −10° C. to the height of −40° C. for each of the sub-regions.

At block 440, lightning discharge data may be obtained for the region. For example, the lightning detection system 120 of FIG. 1 may detect lightning activity across the region and may provide data representing the lightning activity across the region to the computing device 130.

At block 450, a regularization operator and a weighting term may be selected. For example, the computing device 130 may use a heuristic approach to optimize or otherwise determine desirable values for either or both of the regularization operator and the weighting term. In these and other embodiments, an initial value or range of values may be selected for the regularization operator and/or the weighting term. The regularization operator may include a zero-, first-, or second-order derivative operator in some embodiments. In these and other embodiments, the weighting term may include a value greater than zero. In some embodiments, multiple sets of regularization operators and weighting terms may be selected at the block 450.

At block 460, a relational operator may be determined using the regularization operator and the weighting term. For example, the computing device 130 may use the selected regularization operator and weighting terms selected at block 450 to generate the relational operator. In some embodiments, the blocks 450 and 460 may be performed together or simultaneously to optimize or otherwise improve one or more of the regularization operator, the weighting term, and the relational operator. In these and other embodiments, one of the blocks 450 and/or 460 may use Equation (4) of the present disclosure.

At block 470, a probability of lightning strikes in a sub-region may be forecasted based on forecasted radar reflectivity data and the relational operator. For example, the computing device 130 may apply the relational operator to the forecasted radar reflectivity data to yield a forecast of lightning activity for a given time or time period corresponding to the forecasted reflectivity data. In some embodiments, the forecasted lightning activity may be for less than thirty minutes in the future, less than forty minutes in the future, or less than sixty minutes in the future.

All or certain portions of the method 400 may be repeated upon the completion of the block 470. For example, after generating a forecast of lightning activity, forecasts for other segments of time may be generated using the same relational operator. Additionally or alternatively, additional reflectivity data and/or lightning discharge data may be obtained and one or more of the regularization operator, the weighting term, and the relational operator may be modified or updated using the additionally obtained data.

Accordingly, the method 400 may forecast lightning activity. Modifications, additions, or omissions may be made to the method 400 without departing from the scope of the present disclosure. For example, the operations of the method 400 may be implemented in differing order. Additionally or alternatively, two or more operations may be performed at the same time. Furthermore, the outlined operations and actions are provided as examples, and some of the operations and actions may be optional, combined into fewer operations and actions, or expanded into additional operations and actions without detracting from the essence of the disclosed embodiments.

FIG. 5 illustrates an example computational system 500 for performing one or more operations of the present disclosure. The computational system 500 (or processing unit) illustrated in FIG. 5 can be used to perform and/or control operation of any of the embodiments described herein. For example, the computational system 500 can be used alone or in conjunction with other components. As another example, the computational system 500 can be used to perform any calculation, solve any equation, perform any identification, and/or make any determination described here. As another example, the computation system 500 may be used to execute all or portions of the process 400.

The computational system 500 may include any or all of the hardware elements shown in the figure and described herein. The computational system 500 may include hardware elements that can be electrically coupled via a bus 505 (or may otherwise be in communication, as appropriate). The hardware elements can include one or more processors 510, including, without limitation, one or more general-purpose processors and/or one or more special-purpose processors (such as digital signal processing chips, graphics acceleration chips, and/or the like); one or more input devices 515, which can include, without limitation, a mouse, a keyboard, and/or the like; and one or more output devices 520, which can include, without limitation, a display device, a printer, and/or the like.

The computational system 500 may further include (and/or be in communication with) one or more storage devices 525, which can include, without limitation, local and/or network-accessible storage and/or can include, without limitation, a disk drive, a drive array, an optical storage device, a solid-state storage device, such as random access memory ("RAM") and/or read-only memory ("ROM"), which can be programmable, flash-updateable, and/or the like. The computational system 500 might also include a communications subsystem 530, which can include, without limitation, a modem, a network card (wireless or wired), an infrared communication device, a wireless communication device, and/or chipset (such as a Bluetooth® device, a 802.6 device, a WiFi device, a WiMAX device, cellular communication facilities, etc.), and/or the like. The communications subsystem 530 may permit data to be exchanged with a network (such as the network described below, to name one example) and/or any other devices described herein. In many embodiments, the computational system 500 will further include a working memory 535, which can include a RAM or ROM device, as described above.

The computational system 500 also can include software elements, shown as being currently located within the working memory 535, including an operating system 540 and/or other code, such as one or more application programs 545, which may include computer programs of the invention, and/or may be designed to implement methods of the invention and/or configure systems of the invention, as described herein. For example, one or more procedures described with respect to the method(s) discussed above might be implemented as code and/or instructions executable by a computer (and/or a processor within a computer). A set of these instructions and/or codes might be stored on a computer-readable storage medium, such as the storage device(s) 525 described above.

In some cases, the storage medium might be incorporated within the computational system 500 or in communication with the computational system 500. In other embodiments, the storage medium might be separate from the computational system 500 (e.g., a removable medium, such as a compact disc, etc.), and/or provided in an installation package, such that the storage medium can be used to program a general-purpose computer with the instructions/code stored thereon. These instructions might take the form of executable code, which is executable by the computational system 500 and/or might take the form of source and/or installable code, which, upon compilation and/or installation on the computational system 500 (e.g., using any of a variety of generally available compilers, installation programs, compression/decompression utilities, etc.), then takes the form of executable code.

The term "substantially" and "approximately" means within 5% or 10% of the value referred to or within manufacturing tolerances.

Various embodiments are disclosed. The various embodiments may be partially or completely combined to produce other embodiments.

Numerous specific details are set forth herein to provide a thorough understanding of the claimed subject matter. However, those skilled in the art will understand that the claimed subject matter may be practiced without these specific details. In other instances, methods, apparatuses, or systems that would be known by one of ordinary skill have not been described in detail so as not to obscure claimed subject matter.

Some portions are presented in terms of algorithms or symbolic representations of operations on data bits or binary digital signals stored within a computing system memory, such as a computer memory. These algorithmic descriptions or representations are examples of techniques used by those of ordinary skill in the data processing art to convey the substance of their work to others skilled in the art. An algorithm is a self-consistent sequence of operations or similar processing leading to a desired result. In this context, operations or processing involves physical manipulation of physical quantities. Typically, although not necessarily, such quantities may take the form of electrical or magnetic signals capable of being stored, transferred, combined, compared, or otherwise manipulated. It has proven convenient at times, principally for reasons of common usage, to refer to such signals as bits, data, values, elements, symbols, characters, terms, numbers, numerals, or the like. It should be understood, however, that all of these and similar terms are to be associated with appropriate physical quantities and are merely convenient labels. Unless specifically stated otherwise, it is appreciated that throughout this specification discussions utilizing terms such as "processing," "computing," "calculating," "determining," and "identifying" or the like refer to actions or processes of a computing device, such as one or more computers or a similar electronic computing device or devices, that manipulate or transform data represented as physical, electronic, or magnetic quantities within memories, registers, or other information storage devices, transmission devices, or display devices of the computing platform.

The system or systems discussed herein are not limited to any particular hardware architecture or configuration. A computing device can include any suitable arrangement of components that provides a result conditioned on one or more inputs. Suitable computing devices include multipurpose microprocessor-based computer systems accessing stored software that programs or configures the computing system from a general-purpose computing apparatus to a specialized computing apparatus implementing one or more embodiments of the present subject matter. Any suitable programming, scripting, or other type of language or combinations of languages may be used to implement the teachings contained herein in software to be used in programming or configuring a computing device.

Embodiments of the methods disclosed herein may be performed in the operation of such computing devices. The order of the blocks presented in the examples above can be varied—for example, blocks can be re-ordered, combined, and/or broken into sub-blocks. Certain blocks or processes can be performed in parallel.

The use of "adapted to" or "configured to" herein is meant as open and inclusive language that does not foreclose devices adapted to or configured to perform additional tasks or steps. Additionally, the use of "based on" is meant to be open and inclusive, in that a process, step, calculation, or other action "based on" one or more recited conditions or values may, in practice, be based on additional conditions or values beyond those recited. Headings, lists, and numbering included herein are for ease of explanation only and are not meant to be limiting.

While the present subject matter has been described in detail with respect to specific embodiments thereof, it will be appreciated that those skilled in the art, upon attaining an understanding of the foregoing, may readily produce alterations to, variations of, and equivalents to such embodiments. Accordingly, it should be understood that the present disclosure has been presented for-purposes of example rather than limitation, and does not preclude inclusion of such modifications, variations, and/or additions to the present subject matter as would be readily apparent to one of ordinary skill in the art.

That which is claimed:

1. A system for weather prediction, the system comprising:
a radar detection device configured to receive reflections of radar waves reflecting from a plurality of altitudes within an environmental region and generate reflectivity data representing the reflections of radar waves;
a lightning discharge detecting device configured to generate lightning discharge data representing location and time of lightning discharges within the environmental region;
a computing device in communication with the radar detection device and the lightning discharge detecting device, the computing device configured to:
receive the reflectivity data from the radar detection device;
divide the reflectivity data into a plurality of sub-regions within the environmental region;
integrate the reflectivity data across the plurality of altitudes for the sub-regions;
receive the lightning discharge data from the lightning discharge detecting device;
select a regularization operator and a weighting term used in determining a relational operator based on the reflectivity data and the lightning discharge data;
determine the relational operator that relates reflectivity data to lightning discharge data based on the regularization operator and the weighting term;
obtain forecasted radar data predicting future reflectivity data for the environmental region; and
forecast a probability of lightning strikes in at least one of the sub-regions based on the forecasted radar data and the relational operator.

2. The system of claim 1, wherein the regularization operator and the weighting term are selected using a grid search approach of potential values for the regularization operator and the weighting term with the received reflectivity data and the received lightning discharge data.

3. The system of claim 1, wherein the regularization operator is represented by $\Gamma$, the weighting term is represented by $\lambda$, the relational operator is represented by $C$, the integrated reflectivity data is represented by $Z_i$, and the lightning discharge data is represented by $L$, and the relations operator is determined using $$C = (Z_i^T Z_i + \lambda_i \Gamma^T \Gamma)^{-1} Z_i^T L.$$

4. The system of claim 1, wherein the computing device is further configured to:
receive additional reflectivity data from the radar detection device;
receive additional lightning discharge data from the lightning discharge detecting device; and revise the relational operator based on the additional reflectivity data and the additional lightning discharge data.

5. The system of claim 4, wherein the computing device is further configured to revise the regularization operator and the weighting term based on the additional reflectivity data and the additional lightning discharge data.

6. The system of claim 1, wherein the relational operator is further based on one or more additional regularization operators or additional weighting terms.

7. The system of claim 1, wherein the computing device is further configured to generate the forecasted radar data.

8. The system of claim 1, wherein the computing device is further configured to perform a grid search and validation to determine a spatial filter size to apply in generating the forecasted radar data.

9. The system of claim 8, wherein the computing device is further configured to transmit the spatial filter size to a third party that generates the forecasted radar data.

10. A method comprising:
obtaining, by a processor configured to execute computer-readable instructions, radar reflectivity data from a radar detection device for a plurality of altitudes over an environmental region for a past period of time;
dividing, by the processor, the radar reflectivity data into a plurality of sub-regions within the environmental region;
obtaining, by the processor, lightning discharge data for the environmental region from a lightning discharge detecting device for a past period of time;
establishing, by the processor, a customizable mathematical operator based on the radar reflectivity data and the lightning discharge data, the customizable mathematical operator relating the radar reflectivity data to the lightning discharge data;
receiving, by the processor, forecast radar data for at least one of the sub-regions for a future time period, the forecast radar data including a short term forecast of reflectivity data of the environmental region for the future time period; and
forecasting, by the processor, a probability of lightning strikes in at least one of the sub-regions based on applying the customizable mathematical operator to the forecast radar data.

11. The method according to claim 10, wherein establishing the customizable mathematical operator comprises:
selecting a regularization operator and a weighting term based at least on the radar reflectivity data and the lightning discharge data; and
determining a relational operator using at least the regularization operator and the weighting term.

12. The method of claim 11, wherein selecting the regularization operator and the weighting term includes using a grid search approach of potential values for the regularization operator and the weighting term with the obtained radar reflectivity data and the obtained lightning discharge data.

13. The method of claim 11, wherein the regularization operator is represented by $\Gamma$, the weighting term is represented by $\lambda$, the relational operator is represented by C, the radar reflectivity data is represented by $Z_i$, and the lightning discharge data is represented by L, and the relational operator is determined using $$C = (Z_i^T Z_i + \lambda \Gamma^T \Gamma)^{-1} Z_i^T L.$$

14. The method of claim 10, further comprising generating a message with a variable level of warning that corresponds to a density of the probability of lightning strikes.

15. The method of claim 10, further comprising generating the probability of lightning strikes for each of a plurality of time segments.

16. The method of claim 15, wherein each of the probability of lightning strikes for each of the plurality of time segments is based on a different forecast for each of the plurality of time segments.

17. The method of claim 15, wherein the plurality of time segments span between approximately zero and one hundred and twenty minutes.

18. A non-transitory computer-readable medium containing instructions that, when executed by one or more processors, are configured to perform one or more operations, the operations comprising:
obtaining, by the one or more processors, radar reflectivity data from a radar detection device for a plurality of altitudes over an environmental region for a past period of time;
dividing, by the one or more processors, the radar reflectivity data into a plurality of sub-regions within the environmental region;
obtaining, by the one or more processors, lightning discharge data for the environmental region from a lightning discharge detecting device for a past period of time;
establishing, by the one or more processors, a relational operator based on the radar reflectivity data and the lightning discharge data, the relational operator relating the radar reflectivity data to the lightning discharge data;
receiving, by the one or more processors, forecast radar data for at least one of the sub-regions for a future time period, the forecast radar data including a short term forecast of reflectivity data of the environmental region for the future time period; and
forecasting, by the one or more processors, a probability of lightning strikes in at least one of the sub-regions based on applying the relational operator to the forecast radar data.

19. The non-transitory computer-readable medium of claim 18, wherein the operations further include:
obtaining additional reflectivity data;
obtaining additional lightning discharge data; and
revising the relational operator based on the additional reflectivity data and the additional lightning discharge data.

20. The non-transitory computer-readable medium of claim 18, wherein the operation to establish the relational operator comprises:
selecting a regularization operator and a weighting term based at least on the radar reflectivity data and the lightning discharge data; and
determining the relational operator using at least the regularization operator and the weighting term;
wherein the regularization operator is represented by $\Gamma$, the weighting term is represented by $\lambda$, the relational operator is represented by C, the radar reflectivity data is represented by $Z_i$, and the lightning discharge data is represented by L, and the relational operator is determined using $$C = (Z_i^T Z_i + \lambda \Gamma^T \Gamma)^{-1} Z_i^T L.$$

* * * * *